US007894291B2

(12) United States Patent
Braceras et al.

(10) Patent No.: US 7,894,291 B2
(45) Date of Patent: Feb. 22, 2011

(54) CIRCUIT AND METHOD FOR CONTROLLING A STANDBY VOLTAGE LEVEL OF A MEMORY

(75) Inventors: George M. Braceras, Essex Junction, VT (US); John A. Fifield, Underhill, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 1104 days.

(21) Appl. No.: 11/162,847

(22) Filed: Sep. 26, 2005

(65) Prior Publication Data

US 2007/0070769 A1    Mar. 29, 2007

(51) Int. Cl.
*G11C 5/14* (2006.01)
(52) U.S. Cl. ........................... 365/229; 365/227
(58) Field of Classification Search ................ 365/229, 365/227, 154, 156
See application file for complete search history.

(56) References Cited

U.S. PATENT DOCUMENTS

| | | | |
|---|---|---|---|
| 5,034,923 A | 7/1991 | Kuo et al. | |
| 5,852,573 A | 12/1998 | Yang et al. | |
| 5,986,932 A | 11/1999 | Ratnakumar et al. | |
| 6,327,213 B1 | 12/2001 | Ooishi | |
| 6,333,874 B2 * | 12/2001 | Yamauchi | 365/189.09 |
| 6,363,005 B1 | 3/2002 | Wang et al. | |
| 6,504,784 B1 * | 1/2003 | Kokubo | 365/229 |
| 6,535,443 B1 * | 3/2003 | OuYang et al. | 365/207 |
| 6,552,923 B2 | 4/2003 | Houston | |
| 6,657,911 B2 | 12/2003 | Yamaoka et al. | |
| 6,678,202 B2 | 1/2004 | Scott | |
| 6,738,305 B1 | 5/2004 | Liaw | |
| 6,836,179 B2 | 12/2004 | Mizuno et al. | |
| 7,227,804 B1 * | 6/2007 | Kothandaraman et al. | 365/229 |
| 2003/0012048 A1 | 1/2003 | Chappell et al. | |
| 2004/0090820 A1 | 5/2004 | Pathak et al. | |
| 2004/0130960 A1 | 7/2004 | Houston et al. | |

FOREIGN PATENT DOCUMENTS

JP           2001036396        9/2001

* cited by examiner

*Primary Examiner*—Anh Phung
(74) *Attorney, Agent, or Firm*—Michael J. Le Strange

(57) ABSTRACT

A memory is provided which can be operated at an active rate of power consumption in an active operational mode and at a predetermined reduced rate of power consumption in a standby operational mode. The memory includes a current generating circuit which is operable to supply a predetermined magnitude of current to a sample power supply input terminal of a sample memory cell representative of memory cells of the memory, the predetermined magnitude of current corresponding to the predetermined reduced rate of power consumption. A voltage follower circuit is operable to output a standby voltage level equal to a voltage level at the sample power supply input terminal when the predetermined magnitude of current is supplied thereto. A memory cell array of the memory is operable to store data. In the standby operational mode, a switching circuit is operable to supply power at the standby voltage level to a power supply input terminal of the memory cell array. This permits data to remain stored in the memory during the standby mode. During an active operational mode, the switching circuit is operable to connect the power supply input terminal at the power supply to supply power at the active voltage level to the memory cell array. During the active operational mode, data can be stored into the memory cell array and retrieved from the memory cell array.

20 Claims, 4 Drawing Sheets

CIRCUIT AND METHOD FOR CONTROLLING A STANDBY VOLTAGE LEVEL OF A MEMORY

BACKGROUND OF THE INVENTION

The present invention relates to integrated circuit memories, and more particularly to a circuit and method of reducing a rate of power consumption of a memory during a standby mode of operation.

In present and planned future technologies, static random access memories ("SRAMs") tend to consume high amounts of power during standby operational modes when SRAMs are being used only to retain already stored data.

An improved way is needed to reduce power consumption during a standby operational mode.

SUMMARY OF THE INVENTION

In accordance with one aspect of the invention, a memory is provided which can be operated at an active rate of power consumption in an active operational mode and at a predetermined reduced rate of power consumption in a standby operational mode. The memory includes a current generating circuit which is operable to supply a predetermined magnitude of current to a sample power supply input terminal of a sample memory cell representative of memory cells of the memory, the predetermined magnitude of current corresponding to the predetermined reduced rate of power consumption. A voltage follower circuit is operable to output a standby voltage level equal to a voltage level at the sample power supply input terminal when the predetermined magnitude of current is supplied thereto. A memory cell array of the memory is operable to store data. In the standby operational mode, a switching circuit is operable to supply power at the standby voltage level to a power supply input terminal of the memory cell array. This permits data to remain stored in the memory during the standby mode. During an active operational mode, the switching circuit is operable to connect the power supply input terminal to supply power to the memory cell array at the active voltage level. During the active operational mode, data can be stored into the memory cell array and retrieved from the memory cell array.

In accordance with another aspect of the invention, a method is provided for operating a memory to reduce a rate of power consumption. Such method includes supplying a predetermined magnitude of current to a sample power supply input terminal of at least one sample memory cell representative of memory cells of the memory. In such case, the predetermined magnitude of current corresponds to the predetermined reduced rate of power consumption. A voltage level is detected at the sample power supply input terminal, and a voltage level at a power supply voltage terminal of the memory is reduced to a standby voltage level, that level corresponding to the detected voltage level. The standby voltage level is then maintained at the power supply voltage terminal while the memory is operated in the standby operational mode to continue storing data within the memory cells of the memory. The memory is also operated in an active operational mode to store data into and retrieve data from the memory cells of the memory while maintaining an active voltage level at the power supply voltage terminal, the active voltage level being higher than the standby voltage level.

In accordance with another aspect of the invention, a method is provided for operating a memory to reduce a rate of power consumption. Such method includes limiting a current conducted through a voltage power supply terminal of the memory to a predetermined magnitude such that a voltage level at the voltage power supply terminal is driven to a standby voltage level lower than an active voltage level. The memory is operated in the standby operational mode using the standby voltage level at the voltage power supply terminal to achieve the predetermined reduced rate of power consumption. In an active operational mode, the memory is operated using the active voltage level at the voltage power supply terminal.

DETAILED DESCRIPTION

Figure 1:
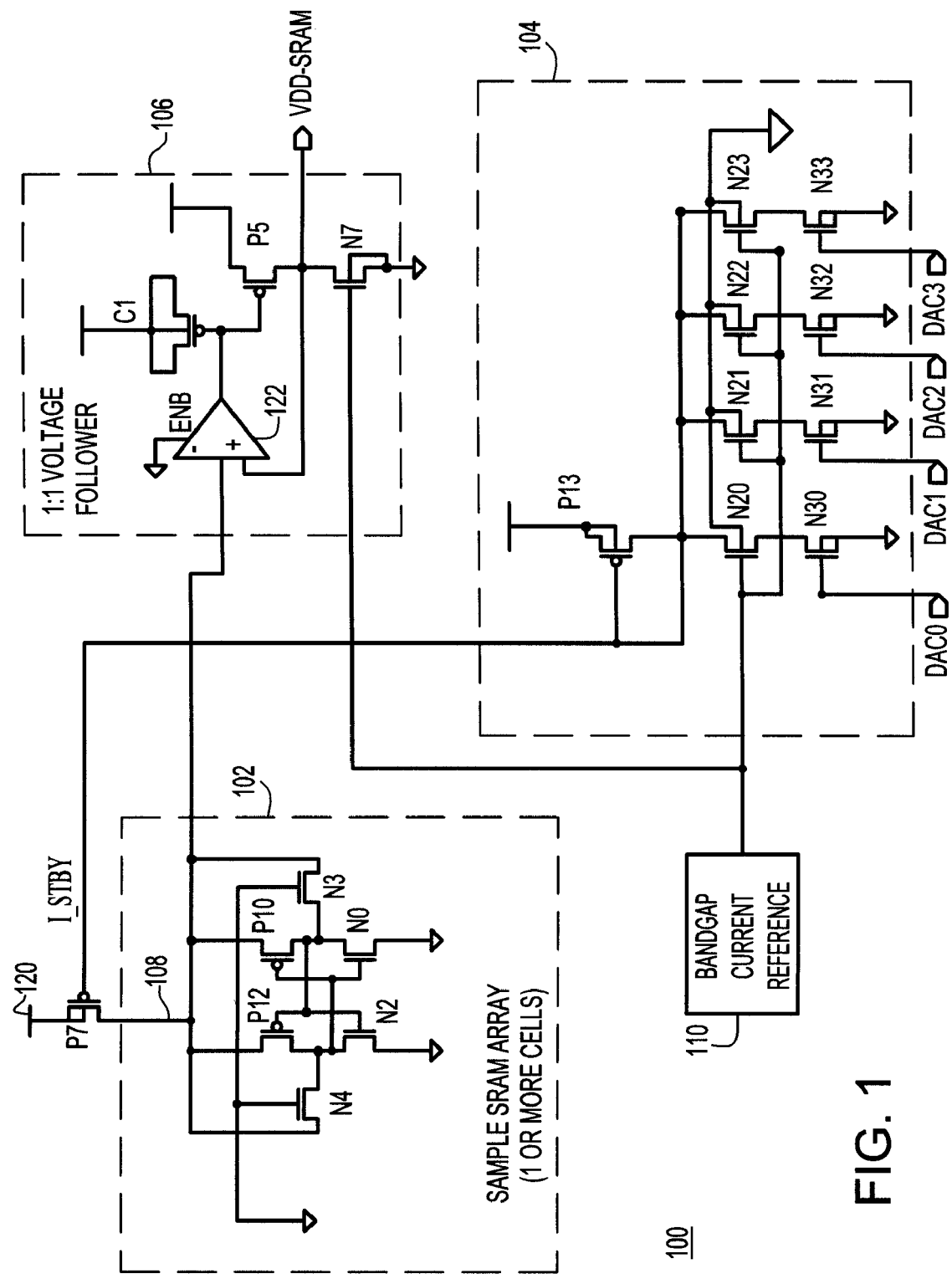
FIG. 1 is a block and schematic diagram illustrating a circuit operable to generate a standby voltage level in accordance with an embodiment of the invention.

In accordance with an embodiment of the invention, a circuit is provided which is operable to generate a standby voltage level, the standby voltage level being a reduced voltage level at which power is supplied to a memory. During a standby mode of operation, data remains stored in a memory cell array of the memory and precaution must be taken against loss of the stored data. However, power is supplied at the reduced (standby) voltage level in order to reduce power consumption. In an exemplary SRAM according to a current technology, power is normally supplied at a voltage level of 1.1 V. In such SRAM, the amount of current supplied to the SRAM in a standby operational mode, i.e., the "standby current" can be cut in half when the voltage level of the power supplied to the SRAM is reduced from 1.1 V to 0.5 V. In planned future technologies, it is expected that comparable reductions in the amount of the standby current can be achieved with smaller reductions in the voltage level at which power is supplied to the SRAM. As the amount of standby current is expected to be large, e.g., 2 to 4 amperes, it is helpful to be able to reduce the amount of standby current to a known level.

In the embodiments of the invention described herein, the actual level of the standby voltage level is not set by design. Rather, the standby voltage level is set at a level which corresponds to a predetermined magnitude of a current to be supplied to the memory cell array during the standby mode. The predetermined magnitude of the current is an amount of current that the memory cell array requires in order to continue reliably storing the data therein. Stated another way, the predetermined magnitude of the current corresponds to a magnitude of a leakage current that is conducted by the memory cells during the standby mode. When data is to remain reliably stored in the memory cell array, the leakage current must be supplied from a power supply input terminal to the memory cell array in order to avoid nodes within the memory cells from becoming discharged and the data being lost.

Thus, in the embodiments of the invention described herein, the standby voltage level is generated at a level which corresponds to a known amount of leakage current from memory cells of the memory array. This helps achieve a targeted reduction in power consumption because the amount of power consumed by the memory cell array can be determined directly from the amount of the current and voltage supplied to the memory cell array. In addition, setting the standby voltage at a level corresponding to a known amount of leakage current allows one to judge whether the standby voltage level is sufficient to retain the data stored within the memory cell array during the standby mode. Variations in the manufacturing process, and variations in operating temperature and other operating conditions of the memory can cause the amount of leakage current conducted by the memory cell array to vary. Such variations can occur even when power is supplied to the memory cell array at a fixed voltage level. Setting the standby voltage level in a manner according to the embodiments of the invention overcomes the effects of such variations, as it assures that the predetermined amount of current is supplied to the memory cell array.

This contrasts with an approach of setting the power supply to a fixed reduced voltage level during the standby mode to reduce power consumption. Ultimately, power consumption can be reduced in accordance with the embodiments of the invention to a level which is lower than achievable by the contrasted approach. In accordance with the invention, the amount of current supplied during the standby mode is controlled to meet a predetermined level rather than setting the amount of voltage supplied to the memory. The way in which power is reduced during the standby mode allows one to reliably make a trade-off between retention margin and power consumption and to do so without neglecting effects of the variations in the manufacturing process, temperature and so on, as described above.

FIG. 1 illustrates a circuit 100 operable to set a standby voltage level of a memory in accordance with one embodiment of the invention. As shown in FIG. 1, the circuit 100 includes a sample memory cell 102, a programmable or digitally controlled current generator 104 and a voltage follower circuit 106. As shown in FIG. 1, illustratively, the sample memory cell 102 is a six transistor cell of a static random access memory ("SRAM"). The sample memory cell is constructed to be subject to the same kinds of geometric and/or proximity effects that exist in actual SRAM cells of the SRAM cell array which is to be controlled.

The sample memory cell includes cross-coupled p-type field effect transistors ("PFETs") P10 and P12, as well as cross-coupled n-type field effect transistors ("NFETs") N0 and N2. These four transistors P10, P12, N0 and N2 are operable to retain a stored datum in the sample memory cell. The sample memory cell also includes two NFETs N3 and N4 which are similar to transistors normally used to provide read and write access to a memory cell of an SRAM. Reference to use of a sample memory cell in the following shall be understood to include use of either a single or a plurality of such sample memory cells. It is advantageous to utilize a plurality of sample memory cells because of an averaging effect that a plurality of such cells has.

The current generator 104 is used to supply a current having a predetermined magnitude through a power supply input terminal 108 of the sample memory cell. The current is selected to have a predetermined magnitude from among a plurality of magnitudes that are selectable by a set of digital control inputs DAC0, DAC1, DAC2 and DAC3 to the current generator 104. The current generator 104 functions as a current mirror circuit, receiving a bandgap current reference at the gates of a set of mirroring NFETs N20, N21, N22, and N23. The bandgap current reference has a stable magnitude, being output by a bandgap current reference generator 110. The current generator uses the bandgap current reference to generate an output current controlled in proportion to the bandgap current reference. The current generator 104 also includes four NFETs N30, N31, N32 and N33 to which the digital control inputs DAC0, DAC1, DAC2 and DAC3 are provided. These devices, in turn, control which of the mirroring NFETs N20, N21, N22, and N23 of the current generator conducts to contribute to the output current at a particular time, thus controlling the amount of current output by the current generator 104. In one embodiment, each of the mirroring NFETs N20, N21, N22 and N23 has the same dimensions as every other mirroring NFET of that group. In such case, it follows that the amount of current conducted by each mirroring NFET is the same for each mirroring NFET. This allows the output current of the current generator to be controlled to a magnitude which progresses linearly, in multiples of 0.25, 0.50, 0.75 and 1.00. However, in another embodiment, the dimensions of the mirroring NFETs are scaled progressively and logarithmically, e.g., in sizes from 1, 2, 4 and to 8. This allows the amount of current output by the current generator to be selected to have a value of zero or a value proportional to any whole number from 1 to 15.

The output of the current generator 104 is coupled to a drain of a main mirroring PFET P13, such main mirroring transistor P13 having a gate terminal tied to its drain terminal. The gate of the main mirroring transistor P13 is also tied to the gate of a PFET P7 connected between a power supply, e.g., VDD (120) and the power supply input terminal 108 of the sample memory cell. The main mirroring transistor P13 preferably has dimensions equal to that of transistor P7. In such case, the current conducted by transistor P7 "mirrors" the current conducted by transistor P13 in that the two currents follow each other so that they have the same magnitude at all times. Ultimately, the current conducted by transistor P7 to the power supply input terminal 108 of the sample memory cell 102 has a magnitude equal to the predetermined magnitude of the current output by the current generator 104.

Accordingly, the current generator 104 allows the current supplied to the sample memory cell to be given a predetermined magnitude selected from a plurality of selectable magnitudes. In the sample memory cell 102, with the gates of the access transistors N3 and N4 being tied to ground as shown in FIG. 1, the sample memory cell is biased in a steady-state condition to retain a stored datum, e.g., the high or low state of a bit. In such condition, the sample memory cell is capable of retaining a stored datum, but in which read/write access to the sample memory cell is prevented. In such condition, the only current conducted by the sample memory cell is an undesired leakage current by one or more of its six transistors. As discussed above, it is necessary to supply current to memory cells of an SRAM even in such steady-state condition, in order to prevent nodes within the memory cells from discharging and causing loss of data. By knowing and selecting the amount of the current supplied to the sample memory cell, it can be judged directly whether the amount of current supplied is sufficient for retaining data within memory cells of the SRAM. Thus, if the selected predetermined amount of current supplied to the sample memory cell is not sufficient to retain data within the memory cells of the SRAM, a higher amount of current can be supplied to the SRAM by altering the values of the digital control inputs to the current generator. Alternatively, if the selected predetermined amount of current supplied to the sample memory cell is more than sufficient to retain data within the memory cells of the SRAM, a lower amount of current can be supplied to the SRAM by altering the values of the digital control inputs to the current generator.

As a result of transistor P7 mirroring the amount of current output by the current generator 104, the voltage level at the power supply input terminal 108 of the sample memory cell falls to a level below the full voltage level that is output from the power supply 120. Such voltage level represents a level at which the sample memory cell 102 conducts the selected predetermined amount of current.

As further shown in FIG. 1, a voltage follower circuit 106 is conductively connected to the power supply input terminal 108 of the sample memory array 102. The voltage follower circuit preferably has a 1:1 amplification ratio such that it outputs a standby voltage level which is equal to the voltage level at the power supply input terminal 108 to the sample memory cell. The output of the voltage follower circuit, referenced as "VDD_SRAM" in FIG. 1, is provided as a standby voltage level having a reduced voltage level to which power is to be supplied to memory cells of the SRAM in the standby mode of operation. The voltage follower circuit 106 includes an operational amplifier ("op amp") 122, to which the power supply input terminal 108 of the sample memory cell 102 is conductively connected at a negative input terminal. The output of the op amp 122 is coupled in feedback relation to its positive input terminal through a pair of output devices P5 and N7. A decoupling capacitor Cl is provided to dampen the alternating current ("AC") response to avoid oscillations at the output of op amp 122.

Figure 2:
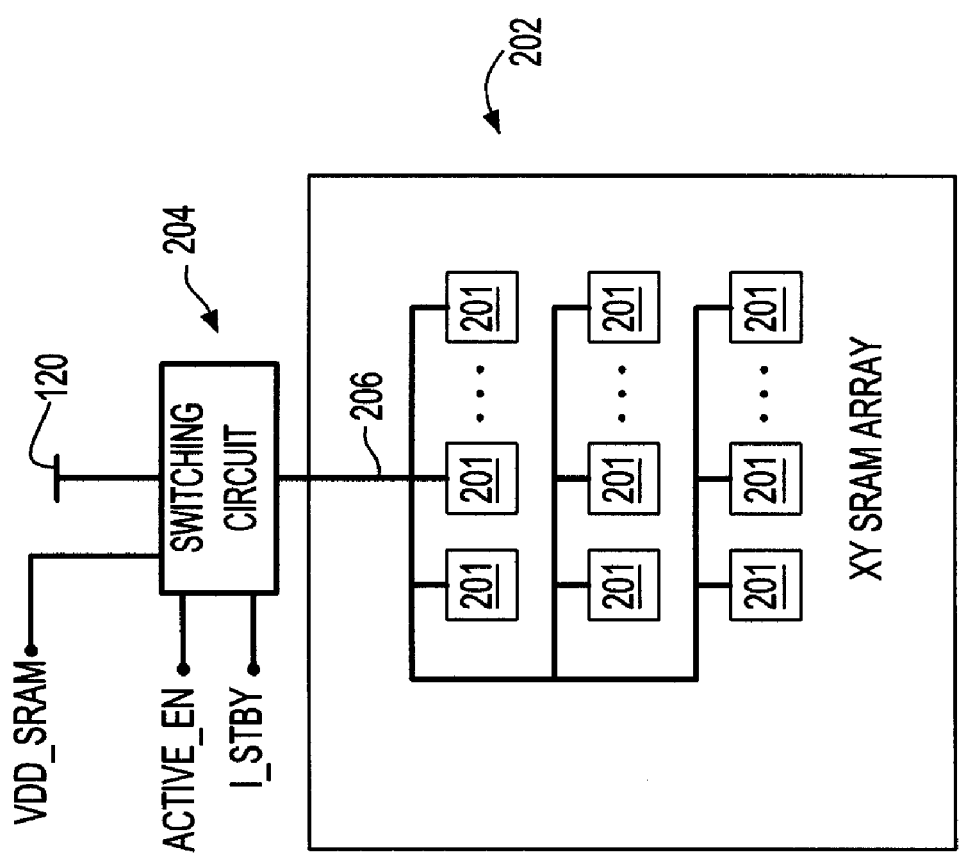
FIG. 2 is a block and schematic diagram illustrating a circuit operable to control a voltage level of power supplied to an SRAM in accordance with an embodiment of the invention.

FIG. 2 illustrates the use of the standby voltage level VDD_SRAM for supplying power to a memory cell array 202 of the SRAM. The memory cell array 202 contains a multiplicity of memory cells 201 with a common power supply input terminal 206. As shown therein, the standby voltage level VDD_SRAM is input to a switching circuit 204 that is disposed between the power supply 120 and a power supply input terminal 206 of the memory cell array 202.

Figure 4:
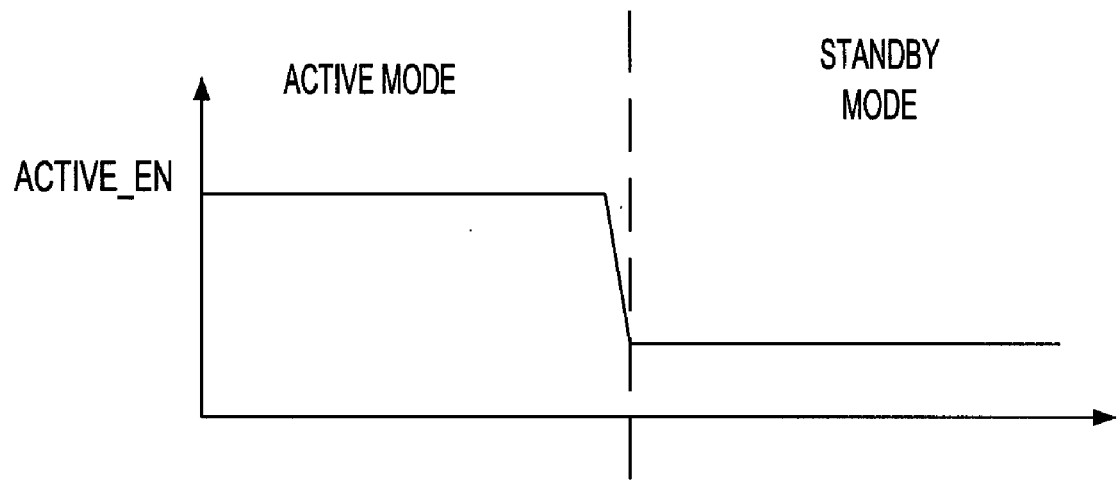
FIG. 4 is a timing diagram showing the polarity of the $ACTIVE_{13}EN$ signal in active mode and in standby mode.

The purpose of the switching circuit is to control whether the SRAM cell array 202 is operated at the standby voltage level or the active voltage level. During the standby operational mode, the switching circuit supplies power to the power supply input terminal 206 at the VDD_SRAM standby voltage level. During the active operational mode, the switching circuit 204 supplies power to the power supply input terminal at the active voltage level VDD (120). In one embodiment, the switching circuit 204 includes a first PFET and a second PFET, both having drains connected to the power supply input terminal 206. The first PFET has a source connected to the active mode power supply (120) and a gate to which an inverted version of a control signal ACTIVE_EN is input. The second PFET has a source connected to the VDD_SRAM power supply and a gate to which the control signal ACTIVE_EN is input. In this embodiment, the ACTIVE_EN control signal is an "active high" signal, having a waveform as shown in FIG. 4. Specifically, in this embodiment, ACTIVE_EN is held at a high voltage state during the active operational mode of the SRAM and is held at a low voltage state during the standby mode. In such way, the first PFET is turned on during the active mode to connect the active mode power supply VDD 120 to the power supply input terminal 206 and the second PFET is turned off during the active mode. Conversely, the second PFET is turned on during the standby mode to connect the VDD_SRAM power supply to the power supply input terminal 206 and the first PFET is turned off at that time.

In an alternative embodiment, the switching circuit operates to modulate the flow of power between the power supply VDD 120 having a fixed voltage level and the power supply input terminal 206. In such manner, the standby voltage level can be provided from the same power supply that is used to supply power at the fixed active voltage level during the active operational mode. In such embodiment, the switching circuit includes a gated device having a source connected to the power supply 120 and a drain connected to the power supply input terminal 206. Here, the ACTIVE_EN control signal is somewhat different than it is in the above-described embodiment. ACTIVE_EN turns the gated device fully on during the active mode, allowing the power supply voltage VDD to flow to the power supply input terminal 206 with negligible voltage drop. In the standby polarity of ACTIVE_EN, the voltage input to the gate of the gated device is controlled by the output of a current mirror such as I_STBY (FIG. 1) which is multiplexed to the gate of the gated device. Thus, during standby mode, this gated device functions to supply a standby voltage having the VDD_SRAM level to the power supply input terminal 206, such level being lower than the power supply voltage VDD.

Figure 3:
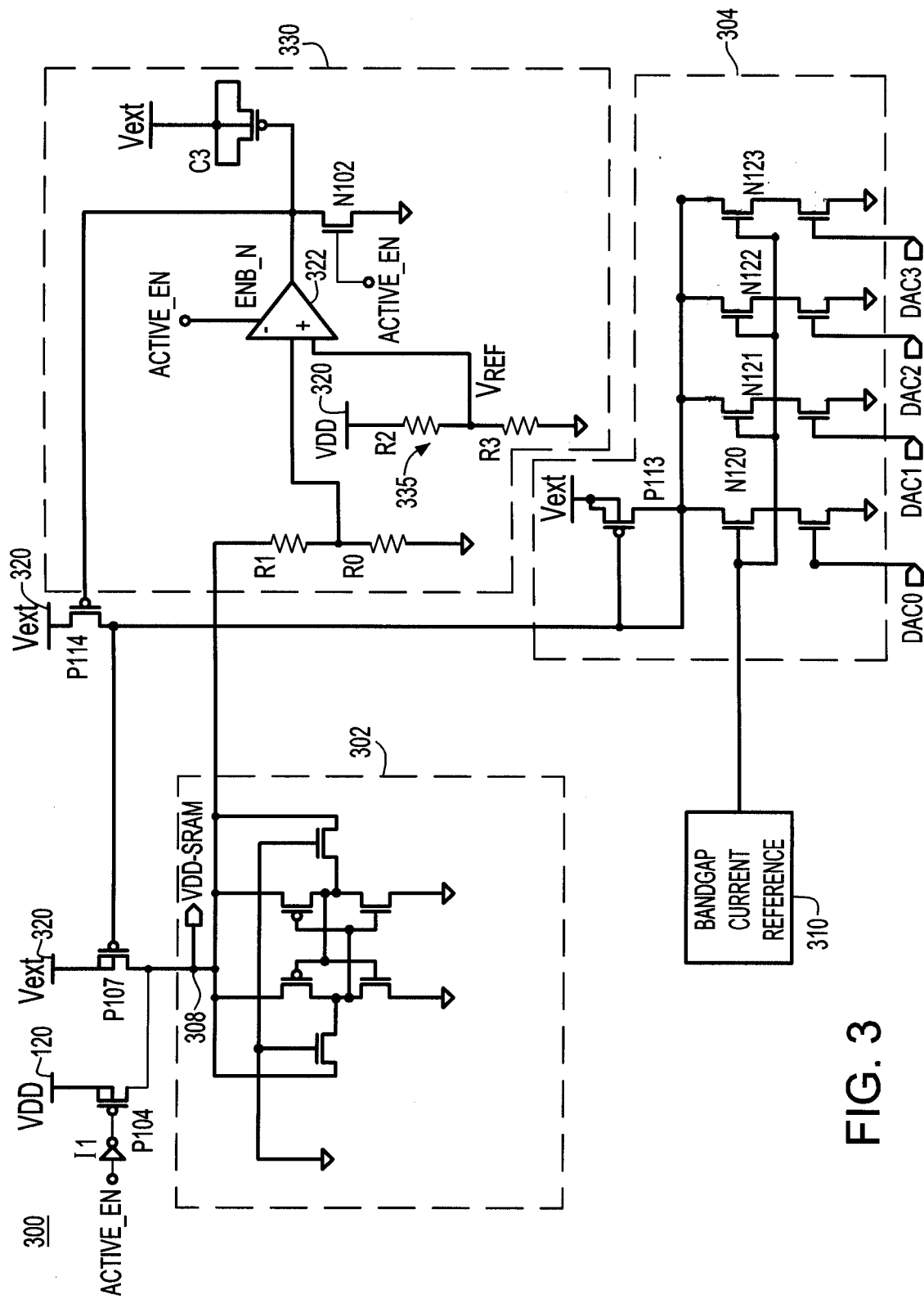
FIG. 3 is a block and schematic diagram illustrating a memory, e.g., SRAM to which power is supplied at a standby voltage level in a standby operational mode and power is supplied at an active voltage level in an active operational mode.

FIG. 3 is a schematic diagram illustrating a memory 300 according to another embodiment of the invention. As shown in FIG. 3, a power supply Vext having a voltage level higher than VDD supplies power to the current generator 304 (at the source of PFET P113), rather than at the VDD power supply, as in the embodiment described above with reference to FIG. 1. In this embodiment, the memory is operable in an active operational mode with an active voltage level supplied to a power supply input terminal and is operable in a standby operational mode with a standby voltage level supplied to the power supply input terminal. Illustratively, the memory is a static random access memory ("SRAM"). A memory cell 302 of the SRAM has a six transistor structure such as that described above with reference to FIG. 1. In this embodiment, a current having a selected magnitude is provided through current mirroring to a defined portion of the SRAM, being illustratively, one SRAM cell, a plurality of SRAM cells or a bank of SRAM cells. This embodiment differs from that shown in FIGS. 1 and 2 in that the magnitude of the current supplied to the SRAM 302 is controlled directly through the current output by the current generator. Thus, this embodiment eliminates the need to first generate a standby voltage level through use of a sample memory cell that is representative of memory cells of the SRAM.

The memory 300 includes a programmed or digitally controlled current generator such as that described with reference to FIG. 1, to which a plurality of digital control inputs DAC0, DAC1, DAC2 and DAC3 are provided, as well as a bandgap current reference from a bandgap reference current generator 310. As determined by the values of the control inputs DAC0, DAC1, DAC2 and DAC3, the current generator 304 selects a magnitude of a current from a plurality of selectable magnitudes. The current having the selected magnitude is output at the drain of transistor P113.

Transistor P107 is connected between a power supply 320 and a power supply input terminal 308 of the SRAM. Illustratively, the power supply 320 has a fixed voltage level ("Vext"), being a voltage level higher than a maximum level of an active voltage level for operating the SRAM in an active operational mode. In a standby mode of the SRAM, transistor P107 mirrors the current output by transistor P113 of the current generator such that current is supplied in that magnitude to the defined portion of the SRAM 302, e.g., an SRAM cell. Through additional mirroring transistors (not shown) connected between the power supply and power supply input terminals of other portions of the SRAM (not shown), the current output by transistor P113 is mirrored to those additional transistors and thus supplies current to those other portions of the SRAM in a predetermined magnitude. When current having that predetermined magnitude is supplied to the SRAM portion 302, the voltage level at the power supply input terminal 308 is reduced to a standby voltage level, referenced in FIG. 3 as "VDD_SRAM".

As shown in FIG. 4, a control signal ACTIVE_EN is an "active high" signal which controls the power supply voltage level that is supplied to the SRAM. ACTIVE_EN is held high during the active operational mode of the SRAM and is held low during the standby mode. When the SRAM operates in the active operational mode, the control signal ACTIVE_EN at the high level is supplied through inverter 11 to a transistor P104 which is coupled between the VDD power supply terminal 120 and the power supply input terminal 308 of the SRAM. Transistor P104 is turned on at that time by an inverted version of the control signal ACTIVE_EN (through inverter 11) such that the voltage at the power supply input terminal 308 is held at the VDD active level during the active mode. ACTIVE_EN is also provided to an enable input ENB_N of op amp 322 to disable the current generator 304. Conversely, during the standby operational mode, the control signal ACTIVE_EN is held low such that the op amp 322 and the current generator 304 are both turned on during the standby mode.

In such way, a current is supplied in a predetermined magnitude to the SRAM. In the standby mode of operation, such current will have a magnitude smaller than that which is conducted when the SRAM operates in an active mode. Moreover, a target reduction in power consumption is achieved directly, by controlling the amount of current that is supplied to the SRAM.

As also shown in FIG. 3, a clamp circuit 330 is provided. The clamp circuit 330 functions to clamp the standby voltage level provided to the SRAM portion 302 at terminal 308 to a maximum level "Vmax". The maximum level is determined by the voltage divider 335, which outputs a reference voltage level VREF which is a fraction of the voltage level of the power supply VDD 120. This fraction of VDD is supplied to the positive input of op amp 322. The negative input of op amp 322 is coupled to a resistive divider R1 and R0 which outputs a fraction of the voltage present at power supply input terminal 308. If the voltage at the terminal 308 rises to a level above VDD, the clamp circuit 330 functions to turn on a clamp device P114 which reduces drive on the current supply device P107. In this manner, clamp circuit 330 prevents the voltage at the power supply input terminal 308 from rising above the active mode voltage level for the SRAM, i.e., the VDD voltage level. A decoupling capacitor C3 is provided to dampen the alternating current ("AC") response to avoid oscillations at the output of op amp 322.

In the memory 300 according to an embodiment of the invention, the rate of power consumption of the SRAM is controlled by limiting an amount of current supplied to the SRAM to a selected predetermined magnitude. However, such magnitude may need to be adjusted, i.e., by lowering the magnitude to further reduce power consumption. Alternatively, the magnitude of the current may be increased to improve the retention of the SRAM during the standby mode. The memory 300 allows such adjustments to be made easily, by changing the values of the digital control inputs to the current generator 304.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A memory operable in an active operational mode having an active rate of power consumption and a standby operational mode having a predetermined reduced rate of power consumption lower than said active rate, comprising:
   a current generating circuit operable to supply a predetermined magnitude of current to a sample power supply input terminal of at least one sample memory cell representative of memory cells of said memory, said predetermined magnitude of current corresponding to said predetermined reduced rate of power consumption;
   a voltage follower circuit operable to output a standby voltage level equal to a voltage level at said sample power supply input terminal when said predetermined magnitude of current is supplied to said sample power supply input terminal;
   a memory cell array operable to store data;
   a switching circuit operable to supply power to a power supply input terminal of said memory cell array at said standby voltage level in said standby operational mode to permit data to remain stored in said memory and to supply power to said power supply input terminal at said active voltage level during said active operational mode to permit data to be stored into said memory cell array and retrieved from said memory cell array.

2. The circuit as claimed in claim 1, wherein said memory includes a static random access memory ("SRAM") and said voltage power supply terminal is conductively connected to source terminals of cross-coupled p-type field effect transistors ("PFETs") of said SRAM.

3. The circuit as claimed in claim 1, wherein said sample memory cell includes a static random access memory ("SRAM") type cell and said sample power supply input terminal is conductively connected to source terminals of cross-coupled p-type field effect transistors ("PFETs") of said SRAM type cell.

4. The circuit as claimed in claim 3, wherein said current generating circuit is operable to supply said predetermined amount of current as a leakage current to said sample SRAM cell.

5. The circuit as claimed in claim 2, wherein said circuit operable to supply said predetermined magnitude of current to said sample power supply input terminal includes a digitally controlled current generator operable to select a magnitude of said current output from said current generator from a plurality of different selectable magnitudes and a transistor connected between said power supply input terminal, said transistor mirroring said current output from said current generator.

6. The circuit as claimed in claim 5, wherein said digitally controlled current generator is operable to select a second magnitude of said current from said plurality of different selectable magnitudes and said transistor is operable to mirror said current output from said current generator having said second selected magnitude to said power supply input terminal of said memory.

7. The circuit as claimed in claim 1, wherein said switching circuit is operable in a partially conductive state during said standby operational mode to control a flow of power from a power supply having a fixed voltage level to said power supply input terminal of said memory cell array so as to maintain said standby voltage level at said power supply input terminal, and is operable in a fully conductive state during said active operational mode to permit a flow of power from said power supply to said power supply input terminal of said memory cell array, such that said active voltage level is maintained at said power supply input terminal.

8. The circuit as claimed in claim 7, wherein said switching circuit is operable to pass said fixed voltage level of said power supply level to said power supply input terminal, said fixed voltage level being said active voltage level.

9. A method of operating a memory to reduce a rate of power consumption, comprising:
supplying a predetermined magnitude of current to a sample power supply input terminal of at least one sample memory cell representative of memory cells of said memory, said predetermined magnitude of current corresponding to said predetermined reduced rate of power consumption;
detecting a voltage level at said sample power supply input terminal;
reducing a voltage level at a power supply voltage terminal of said memory to a standby voltage level, said standby voltage level corresponding to said detected voltage level;
maintaining said standby voltage level at said power supply voltage terminal while operating said memory in said standby operational mode to continue storing data within said memory cells of said memory; and
operating said memory in an active operational mode to store data into and retrieve data from said memory cells of said memory while maintaining an active voltage level at said power supply voltage terminal, said active voltage level higher than said standby voltage level.

10. The method as claimed in claim 9, wherein said step of supplying said predetermined magnitude of current to said at least one sample memory cell includes applying a plurality of variable digital input signals to a digitally controlled current generator to select a magnitude of a current output from said current generator from a plurality of different selectable magnitudes and mirroring said current having said selected magnitude to said voltage power supply terminal to set said predetermined magnitude of current supplied to said at least one sample memory cell.

11. The method as claimed in claim 9, wherein said memory includes a static random access memory ("SRAM") and said voltage power supply terminal is conductively connected to source terminals of cross-coupled p-type field effect transistors ("PFETs") of said SRAM.

12. The method as claimed in claim 9, wherein said sample memory cell includes a static random access memory ("SRAM") type cell and said sample power supply input terminal is conductively connected to source terminals of cross-coupled p-type field effect transistors ("PFETs") of said SRAM type cell.

13. The method as claimed in claim 9, further comprising varying said plurality of variable digital input signals to said digitally controlled current generator to select a second magnitude of said current output from said current generator from said plurality of different selectable magnitudes and mirroring said current having said second selected magnitude to said memory cell to vary said predetermined magnitude of current supplied to said sample memory cell and to vary said predetermined rate of power consumption of said memory.

14. The method as claimed in claim 9, wherein said step of reducing said voltage level at said power supply voltage terminal includes applying said detected voltage through a source follower circuit and applying an output of said source follower circuit to said voltage power supply input terminal of said memory.

15. A method of operating a memory to reduce a rate of power consumption, comprising:
limiting a current conducted through a voltage power supply terminal of said memory to a predetermined magnitude such that a voltage level at said voltage power supply terminal floats to a standby voltage level lower than an active voltage level; and
operating said memory in said standby operational mode using said standby voltage level at said voltage power supply terminal to achieve said predetermined reduced rate of power consumption; and
operating said memory in an active operational mode using said active voltage level at said voltage power supply terminal.

16. The method as claimed in claim 15, further comprising clamping said standby voltage level at a predetermined maximum level.

17. The method as claimed in claim 15, wherein said step of limiting said current at said voltage power supply terminal to said predetermined magnitude includes
applying a plurality of variable digital input signals to a digitally controlled current generator to select a magnitude of a current output from said current generator from a plurality of different selectable magnitudes; and
mirroring said current having said selected magnitude to said voltage power supply terminal to set said predetermined magnitude of current conducted through said voltage power supply terminal.

18. The method as claimed in claim 15, wherein said memory includes a static random access memory ("SRAM") and said voltage power supply terminal is conductively connected to source terminals of cross-coupled p-type field effect transistors ("PFETs") of said SRAM.

19. The method as claimed in claim 15, further comprising varying said plurality of variable digital input signals to said digitally controlled current generator to select a second magnitude of said current output from said current generator from said plurality of different selectable magnitudes and mirroring said current having said second selected magnitude to said voltage power supply terminal to vary said predetermined magnitude of current conducted through said voltage power supply terminal in accordance with said second selected magnitude.

20. The method as claimed in claim 15, wherein
said step of operating said memory in said standby operational mode using said standby voltage level includes biasing a transistor connected between a power supply and said voltage power supply terminal to a partially conductive state at which said predetermined magnitude is conducted by said transistor and
said step of operating said memory in said active operational mode includes switching off said current generator and biasing said transistor to a fully conductive state.

* * * * *